United States Patent
Burcea

(10) Patent No.: US 8,207,762 B2
(45) Date of Patent: Jun. 26, 2012

(54) DIGITAL TIME BASE GENERATOR AND METHOD FOR PROVIDING A FIRST CLOCK SIGNAL AND A SECOND CLOCK SIGNAL

(75) Inventor: George Burcea, Ajax (CA)

(73) Assignee: Siemens Milltronics Process Instruments, Inc., Peterborough (CA)

( * ) Notice: Subject to any disclaimer, the term of this patent is extended or adjusted under 35 U.S.C. 154(b) by 261 days.

(21) Appl. No.: 12/683,194

(22) Filed: Jan. 6, 2010

(65) Prior Publication Data

US 2010/0201408 A1 Aug. 12, 2010

(30) Foreign Application Priority Data

Jan. 8, 2009 (EP) ..................................... 09000149

(51) Int. Cl.
*H03K 21/00* (2006.01)

(52) U.S. Cl. ......... 327/117; 327/119; 327/147; 327/156

(58) Field of Classification Search .................. 327/115, 327/116, 117, 119
See application file for complete search history.

(56) References Cited

U.S. PATENT DOCUMENTS

| | | | |
|---|---|---|---|
| 4,521,778 A | 6/1985 | Knepper | |
| 4,943,787 A | 7/1990 | Swapp | |
| 5,391,996 A | 2/1995 | Marz | |
| 6,104,222 A * | 8/2000 | Embree | 327/156 |
| 6,392,456 B1 * | 5/2002 | Pyeon et al. | 327/156 |
| 6,828,863 B2 * | 12/2004 | Itkin et al. | 331/2 |
| 7,266,352 B2 * | 9/2007 | Soe et al. | 455/209 |
| 7,446,699 B2 | 11/2008 | McEwan | |
| 7,792,510 B2 * | 9/2010 | Pestryakov et al. | 455/260 |
| 7,898,344 B2 * | 3/2011 | Hongo | 331/17 |
| 8,120,433 B2 * | 2/2012 | Kim et al. | 331/37 |
| 2001/0008384 A1 | 7/2001 | Ku | |
| 2003/0155949 A1 | 8/2003 | Itkin et al. | |

FOREIGN PATENT DOCUMENTS

EP 1 320 189 6/2003

* cited by examiner

*Primary Examiner* — Hai L Nguyen

(74) *Attorney, Agent, or Firm* — Cozen O'Connor

(57) ABSTRACT

A digital time base generator and method for providing a first clock signal and a second clock signal in which a base clock signal having a base frequency is generated to provide two clock signals of slightly different frequencies with defined time or phase delay. Here, the base frequency is divided by a first integer to produce a first auxiliary signal, the frequency of the first auxiliary signal is multiplied by a factor to obtain the first clock signal, the base frequency is further divided by a second integer to produce a second auxiliary signal, and the frequency of the second auxiliary signal is multiplied by the factor to obtain the second clock signal.

8 Claims, 3 Drawing Sheets

-- Prior Art --

DIGITAL TIME BASE GENERATOR AND METHOD FOR PROVIDING A FIRST CLOCK SIGNAL AND A SECOND CLOCK SIGNAL

BACKGROUND OF THE INVENTION

1. Field of the Invention

The present invention relates to time base generators and, more particularly, to a digital time base generator and a method for providing a first clock signal and a second clock signal.

2. Description of the Related Art

U.S. Pat. No. 4,521,778 discloses pulse radar ranging systems which provide distance or level measurement based on the direct measurement of the running time of microwave pulses transmitted to and reflected from a target, e. g., the surface of a fill material in a container. The running time for distances of a few meters is in the nanosecond range. Consequently, a special time transformation procedure is required to enable these short time periods to be measured. Here, the microwave pulses are transmitted to the target at a repetition rate or transmit clock frequency which is given by a transmit clock generator. In a signal mixer, the received echo pulses reflected from the target are sampled by cross-correlation with sampling pulses of the same shape as the transmit pulses, but at a sampling clock frequency that is slightly lower than the transmit clock frequency. The cross-correlation and subsequent integration or low-pass filtering leads to an intermediate frequency signal corresponding to the received echo pulses, but time-expanded relative thereto by a factor $T1/(T1-T2)$, where $T1$ is the transmit pulse repetition period and $T2$ is the sampling period. The time-expansion allows for amplifying, digitizing and further processing of the echo pulses with conventional techniques.

Providing the transmit clock frequency and the sampling clock frequency requires a time base of very fine resolution, high accuracy, linearity and stability because of their direct relation to the measurement error. The jitter of the time base has to be kept low because, when the time base becomes significant with respect to the period of the carrier signal (e.g., microwave), the intermediate frequency signal undergoes distortions, amplitude fluctuations and/or cancellations.

It is known to generate the time base signals with digital or with analogue circuits. A digital time base generator having two clock signal generators of slightly different frequencies can benefit from the use of crystal oscillators and phase-locked loop (PLL) circuits that allows the achievement of high accuracy and low jitter. However, as the oscillators start up, the phase difference between the clock signals is unpredictable. Therefore, if a detector for a zero phase delay is used, the detector must be able to operate in the picoseconds range. Zero phase detector errors may diminish the merits of the digital solution and the measurement time is increased due to the necessity to add a waiting time for zero phase detection.

On the other hand, an analogue time base generator uses a linear ramp to generate the variable time delay. The thermal drift of the components results in time delay variations over temperature. U.S. Pat. No. 7,446,699 discloses a technique that compensates for such a thermal drift error. However, the analogue signals having slower variation will still produce a larger jitter from the voltage noise than the digital signals having fast transitions.

U.S. Pat. No. 4,943,787 describes a digital time base generator comprising a base clock signal generator that provides a base clock signal at a base frequency, a first frequency multiplier that multiplies the base frequency by a first integer to produce a first auxiliary signal, a first frequency divider that divides the frequency of the first auxiliary signal by the first integer to generate a first clock signal, a second frequency multiplier that multiplies the base frequency by a second integer to produce a second auxiliary signal, and a second frequency divider that divides the frequency of the second auxiliary signal by the second integer to generate a second clock signal. Accordingly, the frequencies of the first and second clock signals are the same and identical to the base frequency. By altering the first or second integer divisor for a given number of cycles, a defined time delay can be established between the first and second clock signal.

SUMMARY OF THE INVENTION

It is an object of the invention to overcome the prior art drawbacks and to provide two clock signals of slightly different frequencies with defined time or phase delay.

This and other objects and advantages are achieved by a digital time base generator method in which a first and a second clock signal having slightly different frequencies are provided by generating a base clock signal having a base frequency, dividing the base frequency by a first integer to produce a first auxiliary signal, multiplying the frequency of said first auxiliary signal by a factor to obtain said first clock signal, dividing the base frequency by a second integer to produce a second auxiliary signal, and multiplying the frequency of the second auxiliary signal by the factor to obtain the second clock signal.

Starting from the base clock signal with the base frequency f, a relatively large but very accurate reference delay is generated by dividing the base frequency f by the different factors N and M, resulting in the auxiliary signals of the frequencies f/N and f/M. The difference between the periods of these signals is $dt=M/f-N/f$ and represents the reference delay. This reference delay is divided by a factor K to achieve a desired delay resolution $dt/K=(M/f-N/f)/K$. The desired delay resolution is specifically obtained by multiplying the frequencies f/N and f/M of both auxiliary signals by the same factor K. As a result, the first and second clock signals CLK1, CLK2 are generated by the subdivision of a reference delay. In preferred embodiments, the frequency multiplications are each preferably performed by a phase-locked loop.

The time base generator and method in accordance with the invention are preferably used in a radar, laser or time-domain reflectometer, where the first clock signal triggers a transmitter to produce a transmit signal and where the second clock signal gates or is mixed with detected echoes of said transmit signal.

Consequently, time base generator and method in accordance with the invention provides a number of advantages. First, the start conditions can be accurately controlled. Additionally, it is possible to start at any negative delay to allow settling time and accurate measurements around zero delay.

Unlike in other conventional digital time base circuits, the detection of a zero delay in accordance with the time base generator and method of the invention is not necessary because the timing of all circuits can be accurately calculated. Here, the timing of all signals is very accurate and the jitter is minimized by utilizing crystal oscillators and (synchronous) digital circuits.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be now further described by way of a preferred example and with reference to the accompanying drawing, in which.

DETAILED DESCRIPTION OF THE PRESENTLY PREFERRED EMBODIMENTS

Figure 1:
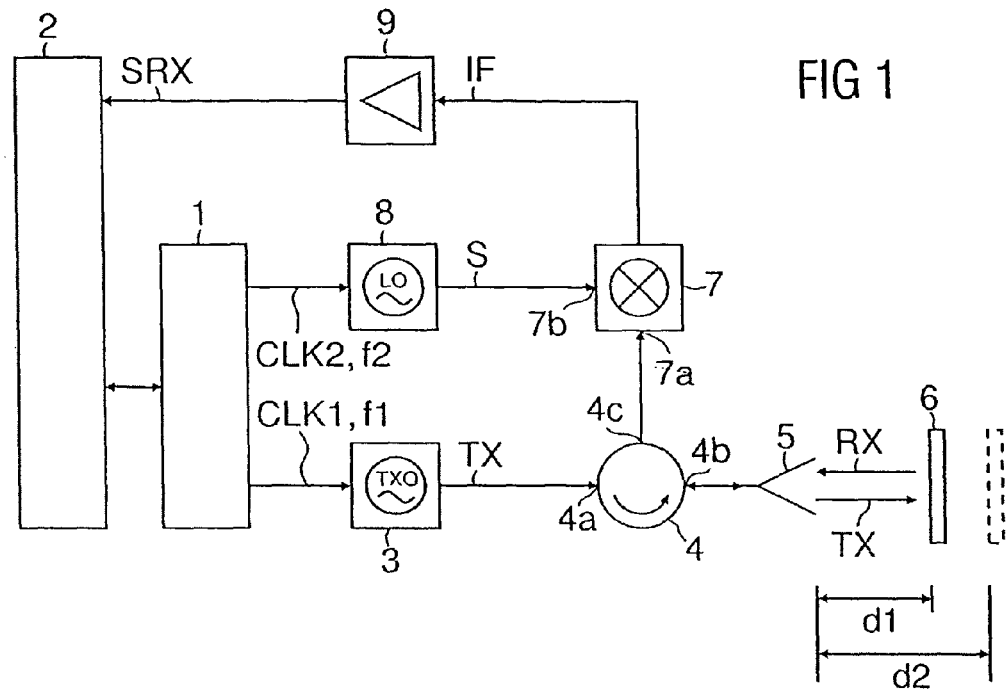
FIG. 1 is a schematic block diagram of a pulse radar ranging system comprising a digital time base generator in accordance with an embodiment of the invention.

With reference to FIG. 1, which is an exemplary illustration of the basic components of a pulse radar ranging system, the system comprises a digital time base generator 1 in accordance with the invention. The time base generator 1, which is under control of a microcontroller 2, generates a first clock signal CLK1 at a first clock frequency f1 in the MHz range. The first clock signal CLK1 triggers a transmit oscillator 3 for generating microwave transmit pulses TX with a pulse repetition rate equal to the first clock frequency f1. The transmit pulses TX may have a duration of 1 ns and a frequency in the GHz range. The transmit oscillator 3 is coupled to a first port 4a of a directional coupler means comprising a four-port circulator 4, a second port 4b of which is coupled to an antenna 5. The transmit pulses TX are transmitted through the circulator 4 and the antenna 5 to a target 6, such as the surface of a fill material in a container. The target 6 reflects the transmit pulses TX back as echo pulses RX which are received by the antenna 5. The received echo pulses RX are guided through the circulator 4 through a third port 4c to a first signal input 7a of a signal mixer 7.

The digital time base generator 1 further generates a second clock signal CLK2 at a second clock frequency f2 which is slightly lower (e.g., by a few kHz) than the first clock frequency f1. The second clock signal CLK2 triggers a local oscillator 8 for generating sampling pulses S of the same shape and frequency as the transmit pulses TX and with a pulse repetition rate equal to the second clock frequency f2. The sampling pulses S are conducted to a second signal input 7b of the signal mixer 7 which generates an intermediate frequency signal or down-converted signal IF by multiplying the received echo pulses RX by the sampling pulses S. The pulse repetition rate of the sampling pulses S is slightly lower than that of the transmit pulses TX. Consequently, the sampling pulses S will sweep in small increments per measuring cycle over the transmit or echo pulse interval so that the received echo pulses RX are sampled by cross-correlation with the sampling pulses S. The cross-correlation and subsequent integration and amplification by an IF amplifier 9 lead to a signal SRX which is expanded in time and corresponds in shape to the received echo pulses RX. This signal SRX is further processed in the microcontroller 2 for determining the running time of the transmit pulses TX to the target 6 and thus the distance d of the target 6 from the antenna 5.

Figure 2:
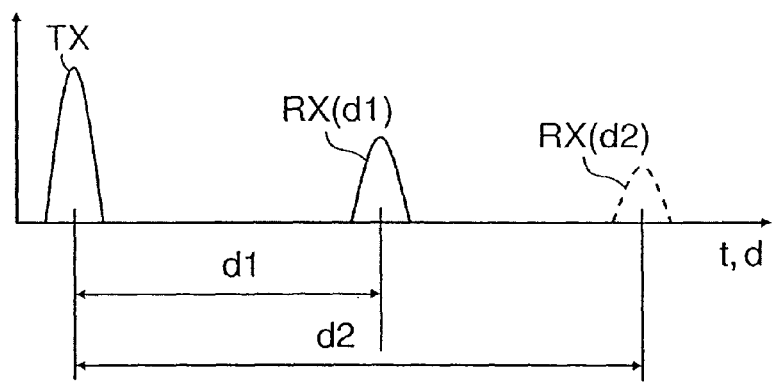
FIG. 2 is a graphical plot of a timing diagram showing transmit and echo pulses in the pulse radar ranging system.

FIG. 2 is a graphical plot of a time diagram of the transmit pulses TX and echo pulses RX (i.e., the down-converted signal IF) for two different distances d1 and d2. The down-converted signal IF only appears when an echo pulse RX reaches the mixer 7 at the same time as a sampling pulse S, i.e., when the delay of signal S (or CLK2) relative to signal TX (or CLK1) equals the propagation delay of TX to the target 4 and back.

Figure 3:
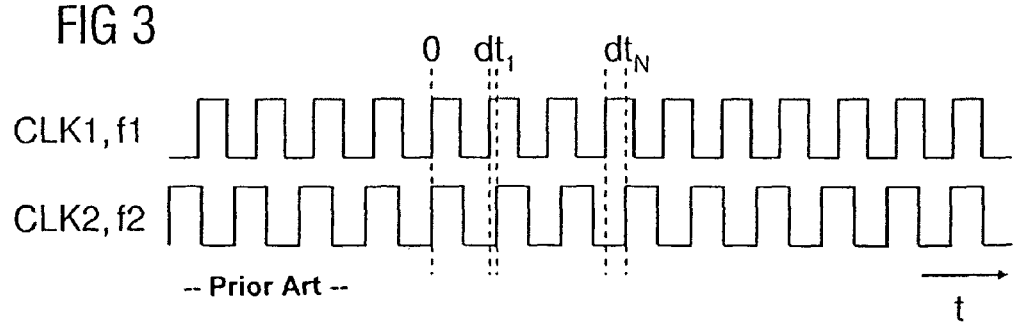
FIG. 3 is a timing diagram showing first and second clock signals generated by a prior art digital time base generator.

FIG. 3 shows the first clock signal CLK1 and second clock signal CLK2 when generated by a prior art digital time base generator having two clock signal generators of slightly different frequencies f1 and f2. FIG. 3 further shows the variation of the time delay between the rising edges of clock signals CLK1 and CLK2 and marks a zero delay 0, the minimum step (increment, resolution) of the delay $dt_1 = 1/f2 - /f1$ and a cumulated delay $dt_N = N \cdot (1/f2 - 1/f1)$ after N pulses. In such a conventional digital time base generator, however, when the two clock signal generators start up, the phase difference between the clock signals CLK1 and CLK2 is not predictable.

Figure 4:
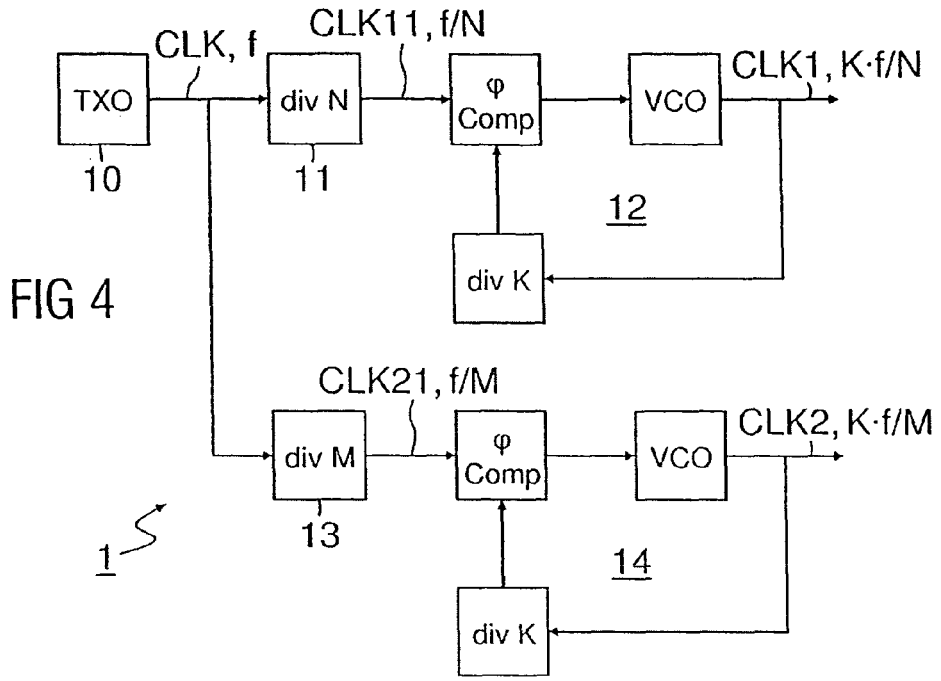
FIG. 4 shows a schematic block diagram of the digital time base generator in accordance with an embodiment of the invention.

FIG. 4 is an exemplary schematic block diagram of the digital time base generator 1 in accordance with the invention. With specific reference to FIG. 4, the digital time base generator 1 comprises a base clock signal generator 10 that generates a base clock signal CLK at a base frequency f. A first frequency divider 11 that divides the base frequency f by a first integer N to produce a first auxiliary signal CLK11. The frequency f/N of the first auxiliary signal CLK11 is multiplied in a first frequency multiplier 12 by a factor K to generate the first clock signal CLK1. A second frequency divider 13 divides the base frequency f by a second integer M and thus produces a second auxiliary signal CLK21. The frequency f/M of the second auxiliary signal CLK21 is multiplied in a second frequency multiplier 14 by the above-mentioned factor K to generate the second clock signal CLK2. In preferred embodiments, the frequency multipliers 12 and 14 each comprise a phase-locked loop (PLL) with a frequency divider in its feedback loop.

Figure 5:
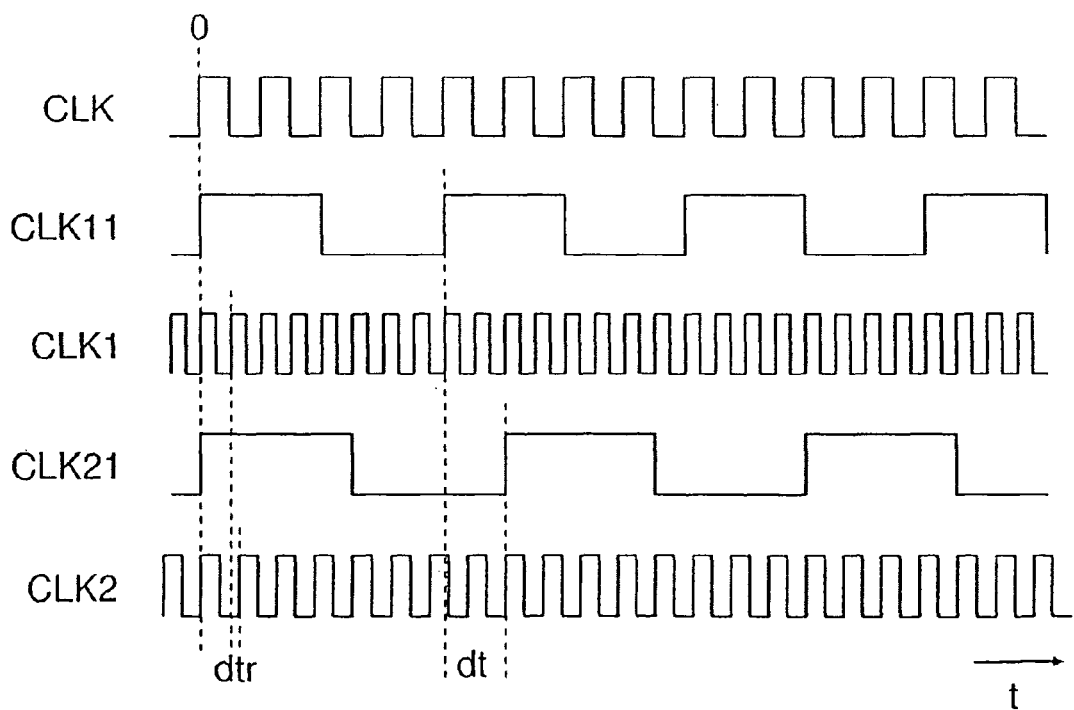
FIG. 5 is a timing diagram showing signals generated in and by the digital time base generator of FIG. 4.

FIG. 5 a timing diagram showing the signals CLK, CLK11, CLK1, CLK21 and CLK2 generated in and by the digital time base generator 1 of FIG. 4. Starting from the base clock signal CLK with the base frequency f, a relatively large but very accurate delay is generated by dividing the base frequency f by the different factors N and M, resulting in the auxiliary signals CLK11 and CLK21 of the frequencies f/N and f/M, respectively. The difference between the periods of these signals CLK11 and CLK21 is $dt = M/f - N/f$ and represents the reference delay. Next, this reference delay dt is divided by a factor K to achieve the desired delay resolution $dtr = dt/K = (M/f - N/f)/K$. This is achieved by multiplying the frequencies f/N and f/M of both auxiliary signals CLK11 and CLK21 by the same factor K. The multiplication operation is equivalent to dividing the periods of these two signals CLK11 and CLK21 by K. Thus, the time base signals (clock signals CLK1, CLK2) are generated by the subdivision of a reference delay.

It should be noted that scalability is an important advantage of the time base. As a result, the time base can be used for one or more periods of the reference delay dt depending on the required measurement distance of the pulse radar ranging system. The transition from one reference interval dt to the next one (or few) is seamless. Once locked (i.e., synchronized), the PLL circuits maintain synchronization between the input frequencies f/N and f/M and their respective frequency multiples.

Figure 6:
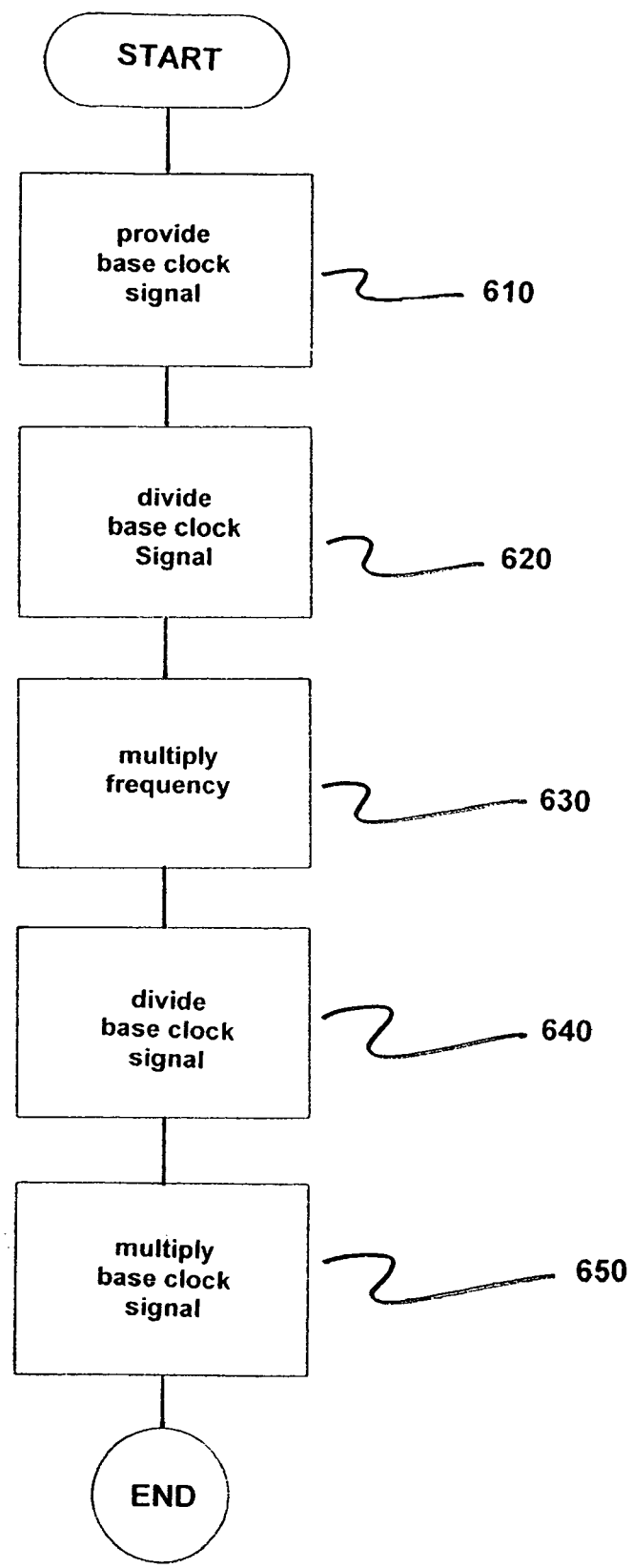
FIG. 6 is a flow chart illustrating the method in accordance with an embodiment of the invention.

FIG. 6 is a flow chart of the method in accordance with the invention. Initially, a base clock signal (CLK) having a base frequency (f) is provided, as indicated in step 610. Next, the base frequency (f) is divided by a first integer (N) to produce a first auxiliary signal (CLK11), as indicated in step 620. The frequency (f/N) of the first auxiliary signal (CLK11) is next multiplied by a factor (K) to obtain said first clock signal (CLK1), as indicated in step 630. Next, the dividing base frequency (f) is divided by a second integer (M) to produce a second auxiliary signal (CLK21), as indicated in step 640. The frequency (f/M) of the second auxiliary signal (CLK21) is multiplied by the factor (K) to obtain the second clock signal (CLK2), as indicated in step 650.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. Moreover, it should be recognized that structures shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A digital time base generator arranged in one of a radar, a laser and time domain reflectometer, the digital time base generator providing a first clock signal and a second clock signal, frequencies of the first and second clock signals being different, the time base generator comprising:
   a base clock signal generator which provides a base clock signal at a base frequency;
   a first frequency divider which divides the base frequency by a first integer to produce a first auxiliary signal;
   a first frequency multiplier which multiplies the frequency of the first auxiliary signal by a factor to generate the first clock signal;
   a second frequency divider which divides the base frequency by a second integer to produce a second auxiliary signal; and
   a second frequency multiplier which multiplies the frequency of the second auxiliary signal by the factor to generate the second clock signal.

2. The digital time base generator of claim 1 incorporated into a radar, laser or time-domain reflectometer, wherein the first clock signal triggers a transmitter to produce a transmit signal and wherein the second clock signal one of gates and is mixed with detected echoes of the transmit signal.

3. The digital time base generator of claim 1, wherein each of the first and second frequency multipliers comprises a phase-locked loop.

4. The digital time base generator of claim 3 incorporated into one of a radar, laser and time-domain reflectometer, wherein the first clock signal triggers a transmitter to produce a transmit signal and wherein the second clock signal one of gates and is mixed with detected echoes of the transmit signal.

5. A method implemented in one of a radar, a laser and time domain reflectometer and for providing a first clock signal and a second clock signal, frequencies of the clock signals being different, said method comprising:
   providing, by a base clock signal generator, a base clock signal having a base frequency;
   dividing, by a first frequency divider, the base frequency by a first integer to produce a first auxiliary signal;
   multiplying, by a first frequency multiplier, a frequency of the first auxiliary signal by a factor to obtain the first clock signal;
   dividing, by a second frequency divider, the base frequency by a second integer to produce a second auxiliary signal; and
   multiplying, by a second frequency divider, the frequency of the second auxiliary signal by the factor to obtain the second clock signal.

6. The method of claim 5, wherein the first clock signal triggers a transmitter to produce a transmit signal and wherein the second clock signal one of gates and is mixed with detected echoes of the transmit signal.

7. The method of claim 5, wherein each of the frequency multiplication is performed by a phase-locked loop.

8. The method of claim 7, wherein the first clock signal triggers a transmitter to produce a transmit signal and wherein the second clock signal one of gates and is mixed with detected echoes of the transmit signal.

* * * * *